(12) United States Patent
Huang et al.

(10) Patent No.: US 9,711,384 B2
(45) Date of Patent: Jul. 18, 2017

(54) PATTERN COATING DEVICE AND PATTERN COATING METHOD THEREOF

(71) Applicant: TPK Touch Solutions Inc., Taipei (TW)

(72) Inventors: Jun-Yao Huang, Miaoli (TW); Ying-Che Chen, New Taipei (TW); Po-Pin Hung, New Taipei (TW); Yi-Tseng Chiang, New Taipei (TW)

(73) Assignee: TPK Touch Solutions Inc. (TW)

( * ) Notice: Subject to any disclaimer, the term of this patent is extended or adjusted under 35 U.S.C. 154(b) by 0 days.

(21) Appl. No.: 14/490,641

(22) Filed: Sep. 18, 2014

(65) Prior Publication Data
US 2015/0086724 A1 Mar. 26, 2015

(30) Foreign Application Priority Data

Sep. 22, 2013 (CN) .......................... 2013 1 0433419

(51) Int. Cl.
| | |
|---|---|
| *B05B 3/18* | (2006.01) |
| *B05C 5/02* | (2006.01) |
| *B05C 5/00* | (2006.01) |
| *B05C 11/10* | (2006.01) |
| *B29C 47/16* | (2006.01) |
| *H01L 21/67* | (2006.01) |
| *B05D 1/26* | (2006.01) |

(Continued)

(52) U.S. Cl.
CPC ........ *H01L 21/6715* (2013.01); *B05C 5/0254* (2013.01); *B05C 5/0266* (2013.01); *B05C 9/02* (2013.01); *B05C 11/1036* (2013.01); *B05D 1/26* (2013.01); *B05B 3/18* (2013.01); *B05C 5/005* (2013.01); *B05C 11/00* (2013.01); *B29C 47/16* (2013.01)

(58) Field of Classification Search
None
See application file for complete search history.

(56) References Cited

U.S. PATENT DOCUMENTS 3,100,161 A * 8/1963 Fairbairn et al. ....... B05C 5/007
118/325
4,248,579 A * 2/1981 Maejima ............. B29C 47/0877
264/169

(Continued)

FOREIGN PATENT DOCUMENTS

| JP | 1982187063 | 11/1982 |
|---|---|---|
| JP | 1994224114 | 8/1994 |

(Continued)

*Primary Examiner* — Binu Thomas
(74) *Attorney, Agent, or Firm* — Paul Bendemire (57) ABSTRACT

A coating device for coating a coating liquid onto a substrate includes: a coating head having a coating-liquid outlet, adapted to move with respect to the substrate along a first axial direction and capable of coating the substrate with coating liquid through the coating-liquid outlet; and adjustment unit connected to the coating head and including a movable pad disposed proximal to the coating-liquid outlet and adapted to move along a second axial direction for adjusting the size of the opening of the coating-liquid outlet; and a drive assembly connected to the adjustment unit for controlling the adjustment unit to move along the second axial direction. Additionally a coating method is provided.

18 Claims, 11 Drawing Sheets

(51) Int. Cl.
*B05C 9/02* (2006.01)
*B05C 11/00* (2006.01)

(56) References Cited

U.S. PATENT DOCUMENTS

| | | | | |
|---|---|---|---|---|
| 4,659,302 A | * | 4/1987 | Maejima | B29C 47/16 425/190 |
| 5,108,526 A | * | 4/1992 | Cornils | B05C 5/0216 156/108 |
| 5,411,897 A | * | 5/1995 | Harvey | H01L 31/022425 228/102 |
| 5,893,951 A | * | 4/1999 | Madrzak | B05C 5/0266 118/118 |
| 6,423,144 B1 | * | 7/2002 | Watanabe | B05C 5/002 118/410 |
| 6,565,660 B1 | * | 5/2003 | Wagner | B05C 5/0266 118/419 |
| 2004/0265407 A1 | * | 12/2004 | Prugh | B29C 47/0019 425/133.5 |
| 2006/0096528 A1 | * | 5/2006 | Kawatake | B05C 5/0262 118/407 |
| 2013/0194350 A1 | * | 8/2013 | Watanabe | B05C 9/10 118/300 |

FOREIGN PATENT DOCUMENTS

| | | |
|---|---|---|
| JP | 1998099764 | 4/1998 |
| JP | 2000126666 | 5/2000 |

* cited by examiner

PATTERN COATING DEVICE AND PATTERN COATING METHOD THEREOF

BACKGROUND OF THE INVENTION

This Application claims priority of China Patent Application No. CN 201310433419.1, filed on Sep. 22, 2013, and the entirety of which is incorporated by reference herein.

Field Of The Invention

The present disclosure relates to a coating device; in particular, to a patterning coating device and a patterning coating method.

Description Of Related Art

Solvent-borne coating, a common technique in semiconductor manufacturing, panel processing and optical film manufacturing, applies viscous solvent liquid on solid carrier surfaces for forming even and thin coatings. Current coating methods include self-metering dip coating, roller coating, blade coating, inkjet coating, and dispensing. Optical coating liquid or functional coating liquid coated on substrates typically need to be patterned by adopting post processing. For example, a photoresist layer is first coated on a substrate and cured into a film, and then patterned through photolithography. Likewise, optical adhesive can be printed on substrates, cured, and then removed for obtaining a patterned coating layer. Post processing not only increases production cost, but also affects the appearance of the coating layer due to foreign contaminants.

Traditional slit coating devices can only create patterns having specific widths (e.g. rectangular patterns), or patterns of regular shapes. However, due to design demands, diverse patterns are required (i.e. irregular patterns) and traditional equipment cannot satisfy these demands.

SUMMARY OF THE INVENTION

The object of the present disclosure is to provide a coating device which controls the pattern of the coating liquid on the substrate through adjustment of a movable pad for accomplishing two-dimensional patterning of the coating.

The present disclosure provides a coating device for coating a coating liquid on a substrate to form a coat layer. The coating device includes: a coating head having a coating-liquid outlet and adapted to move along a first axis with respect to the substrate for coating the substrate with the coating liquid through the coating-liquid outlet; an adjustment unit connected to the coating head and including a movable pad adapted to move along a second axis for adjusting the size of the opening of the coating-liquid outlet; and a drive assembly connected to the adjustment unit for controlling the motion of the adjustment unit along the second axis.

The present disclosure also provides a coating method including the following steps. First, provide a coating device which includes: a coating head having a coating-liquid outlet; an adjustment unit connected to the coating head and having a movable pad disposed at the coating-liquid outlet; and a drive assembly connected to the adjustment unit. Then, dispose a substrate under the coating head. Then, move the coating head along a first axis with respect to the substrate, and at the same time move the movable pad along a second axis by driving the adjustment unit through the drive assembly, for adjusting the size of the opening of the coating-liquid outlet.

The coating device and the coating method provided by the present disclosure adjusts the size of the opening of the coating-liquid outlet such that the coated pattern has an irregular shape by moving the movable pad relative to the coating head when the coating head is moving.

In order to further the understanding regarding the present disclosure, the following embodiments are provided along with illustrations to facilitate the disclosure of the present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 1A:
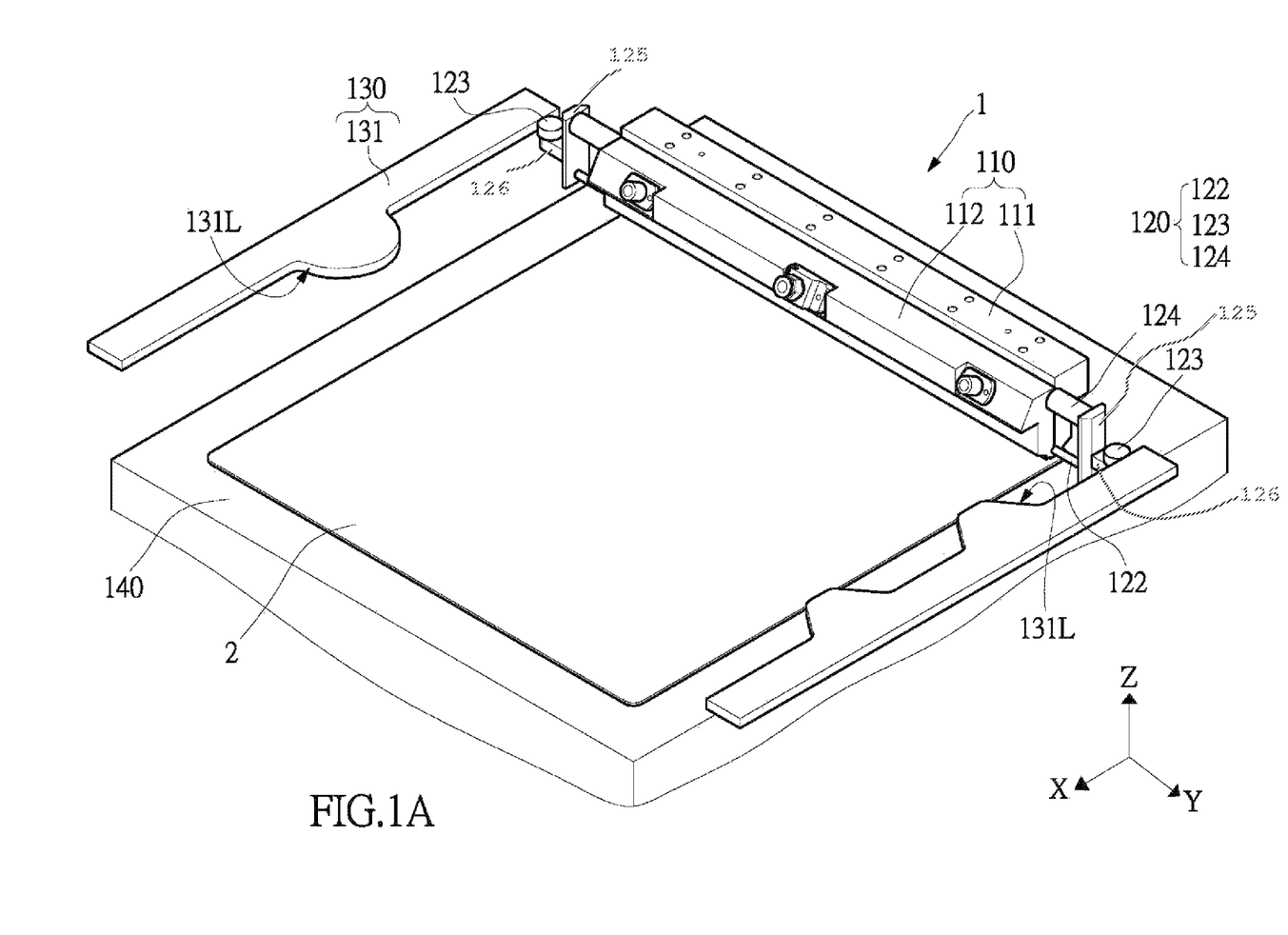
FIG. 1A to FIG. 1C show perspective views of a coating device during operation according to an embodiment of the present disclosure.
Figure 1B:
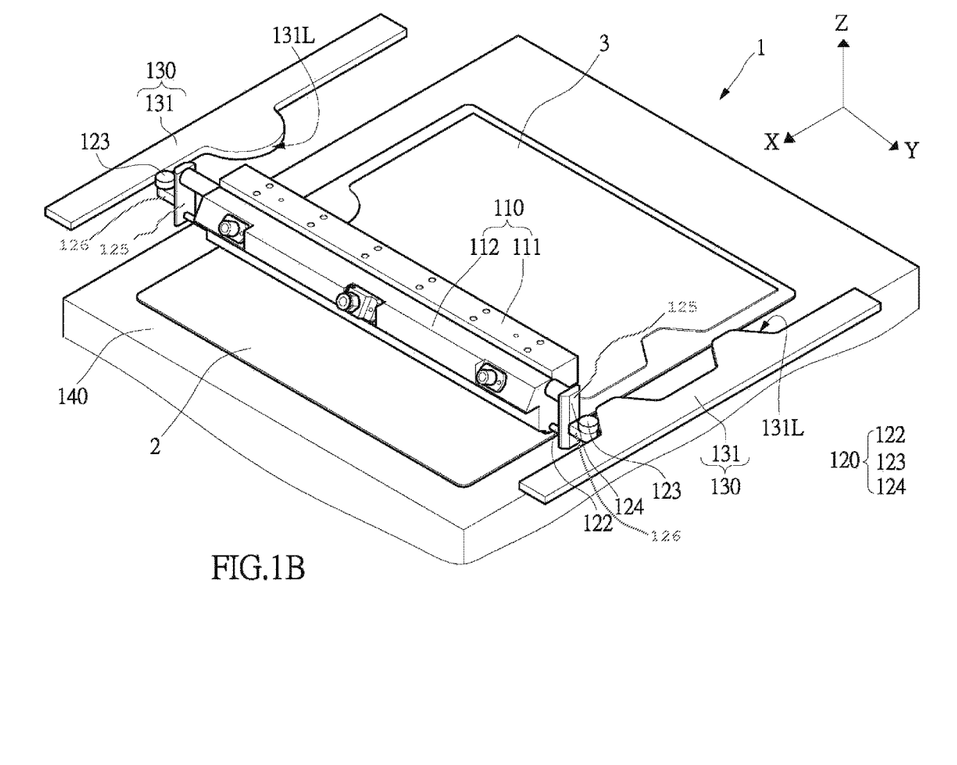
Figure 1C:
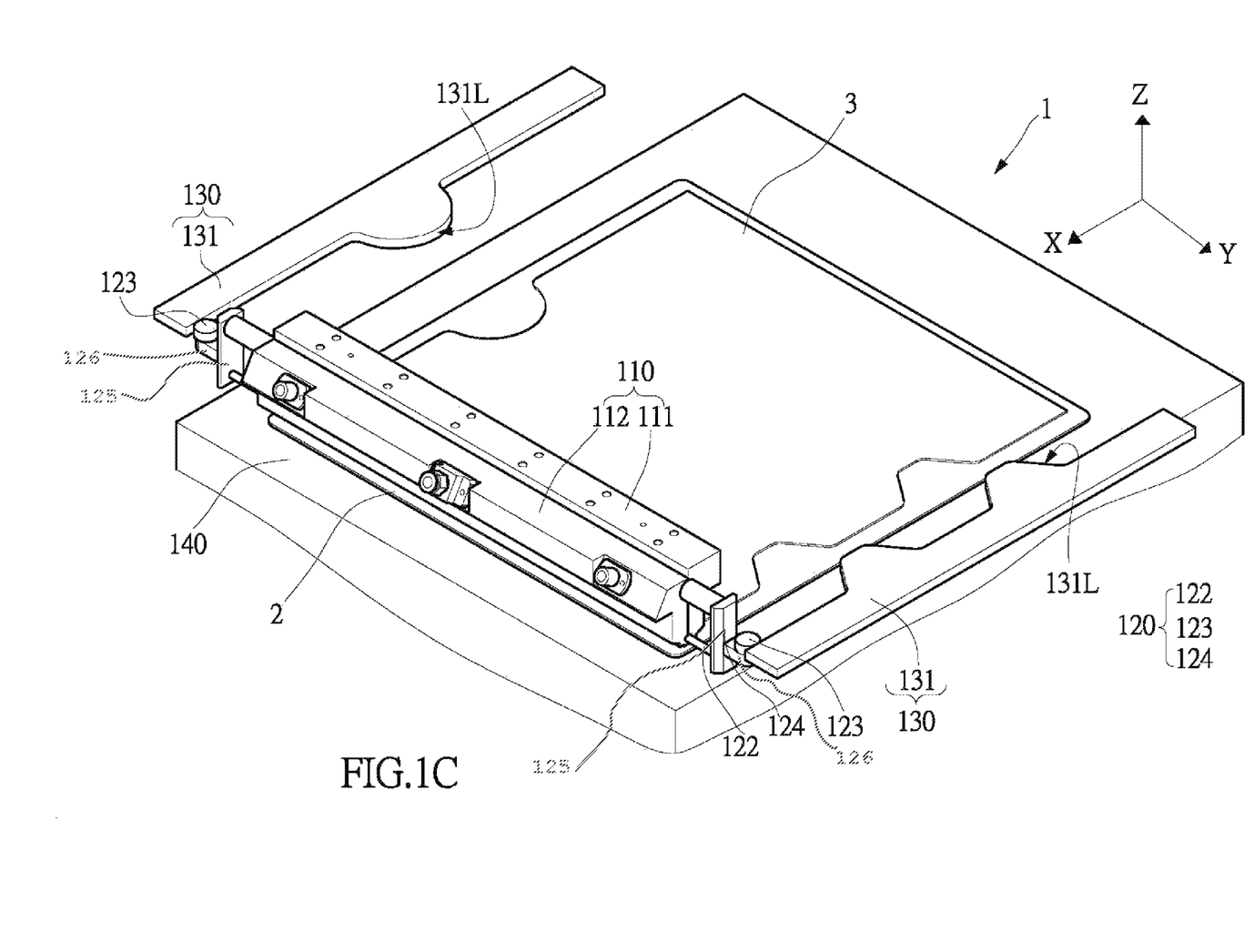

Please refer to FIG. 1A to FIG. 1C for explanation of a coating method of a coating device according to the present disclosure. FIG. 1A to FIG. 1C show perspective views of a coating device during operation according to an embodiment of the present disclosure.

As shown in FIG. 1A, the coating device 1 includes three main components: a coating head 110, an adjustment unit 120, and a drive assembly 130. The adjustment unit 120 is connected to the coating head 110. The drive assembly 130 is connected to the adjustment unit 120. Specific structures of each component are described in detail later.

In the present embodiment, the coating device 1 further includes a carrying platform 140 for carrying a substrate 2 to be coated. The substrate 2 can be attached to the carrying platform 140 by suction, static electricity, or mechanical means. The substrate 2 can be a coil material, such as a glass substrate or a plastic substrate. Also, the substrate 2 can be a laminated substrate, such as a laminated glass substrate.

Referring to FIG. 1B and FIG. 1C, the coating head 110 has a coating-liquid outlet (described later) and during the coating process, the coating head 110 can move along an x-axis with respect to the substrate 2 for coating the substrate 2 with coating liquid through the coating-liquid outlet. In the present embodiment, during the coating process, the carrying platform 140 is stationary and the coating head 110 is moving. It is easily seen that in another embodiment, the coating head 110 can be stationary and the carrying platform 140 can be moving. In yet another embodiment, both the coating head 110 and the carrying platform 140 are moving.

When the coating head 110 moves along the x-axis with respect to the substrate 2, the drive assembly 130 can drive the adjustment unit 120 along the y-axis for adjusting the dimensions of the coating liquid coated by the coating head 110, forming a coat layer 3 shown in FIG. 1C.

The following describes the structure and operating principle of the coating device 1 of the present disclosure.

Figure 2:
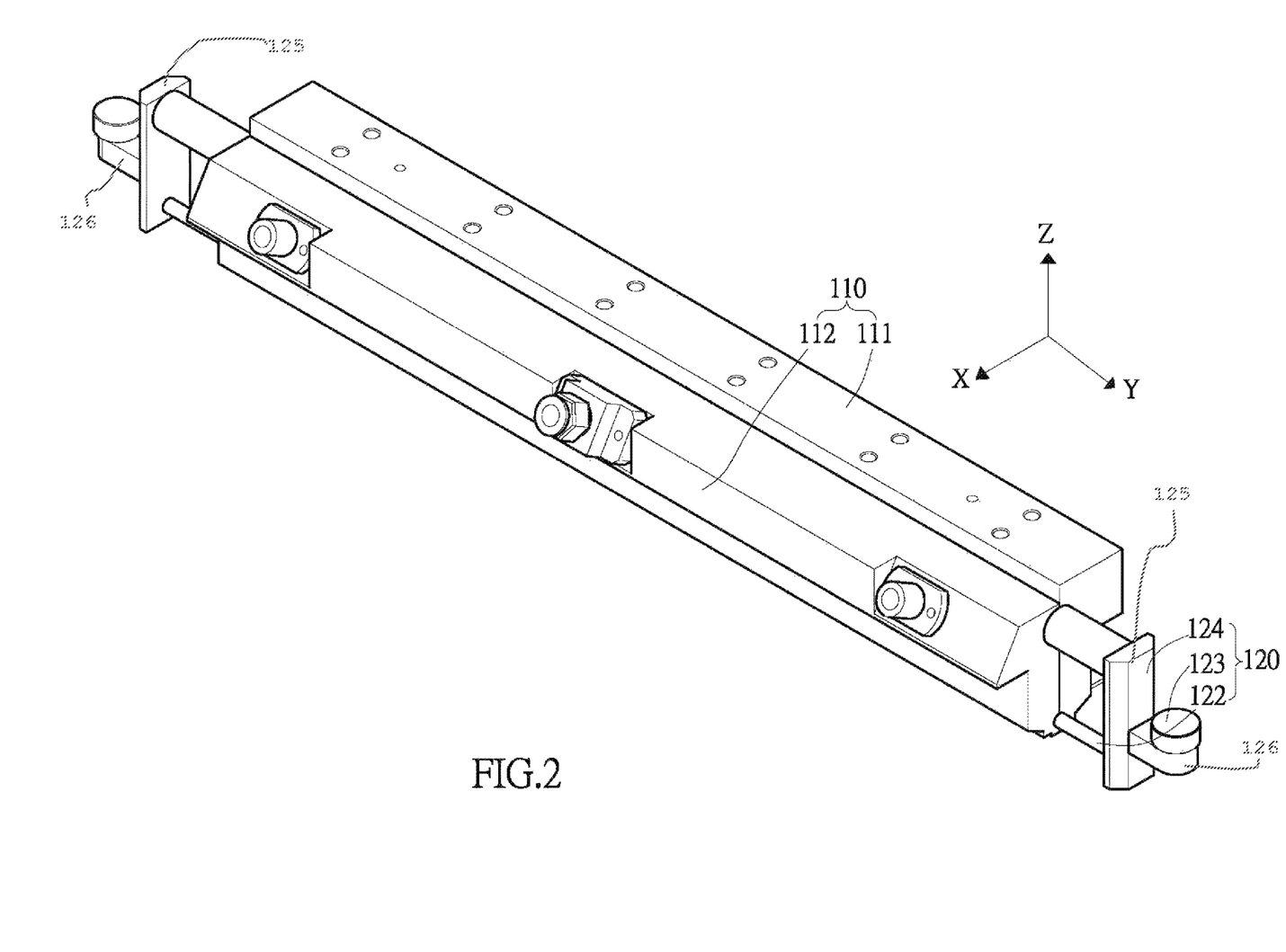
FIG. 2 shows a partial perspective view of a coating device according to an embodiment of the present disclosure.
Figure 3:
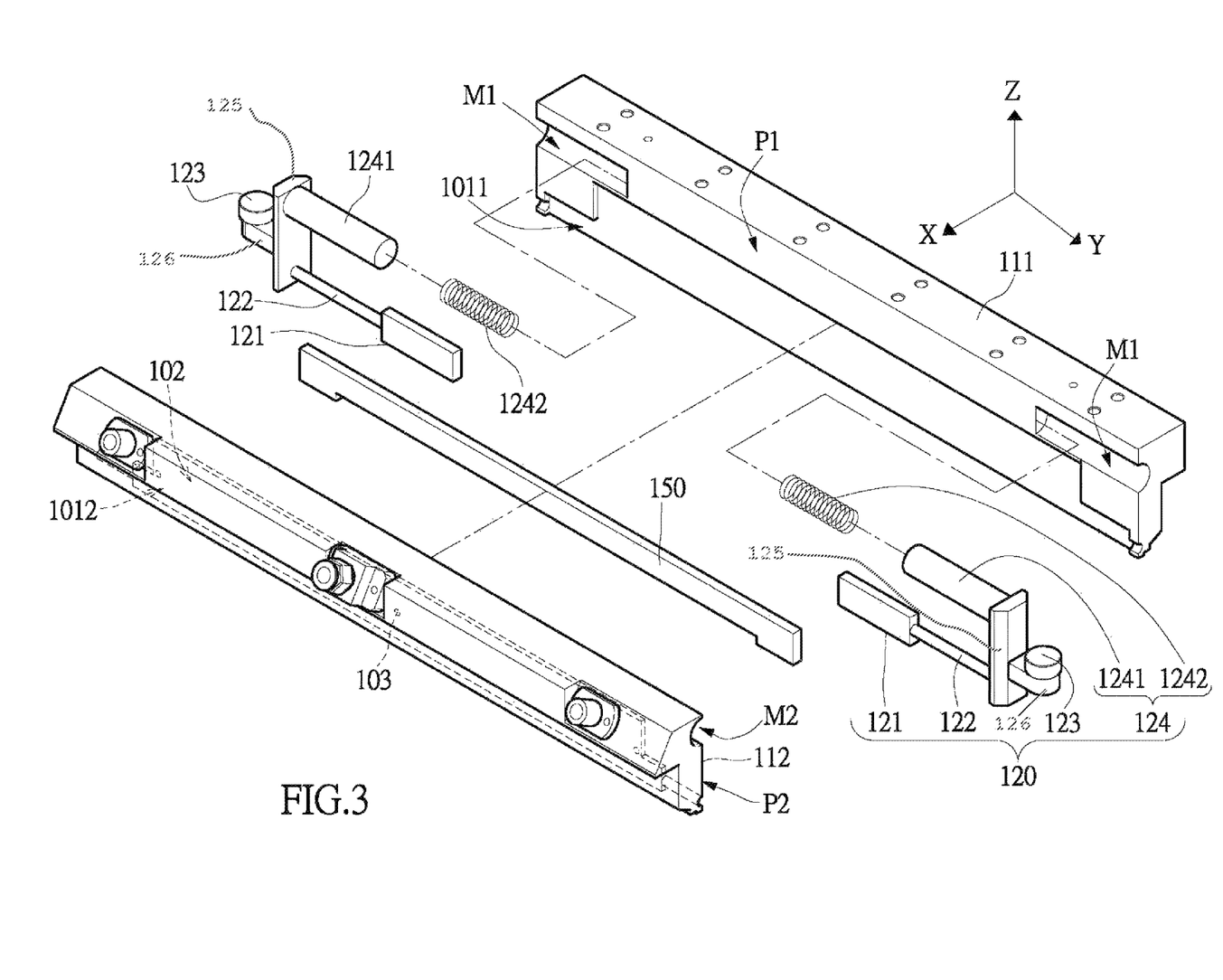
FIG. 3 shows a partial exploded view of the coating device of FIG. 2.
Figure 4A:
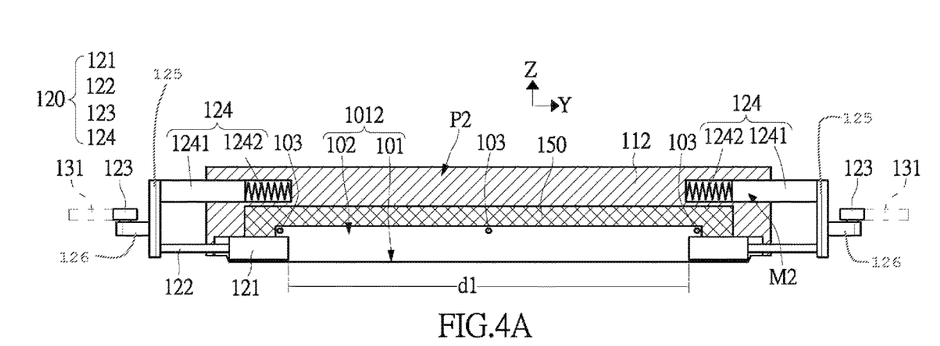
FIG. 4A and FIG. 4B are cross-sectional views of a female mold of a coating device during operation.
Figure 4B:
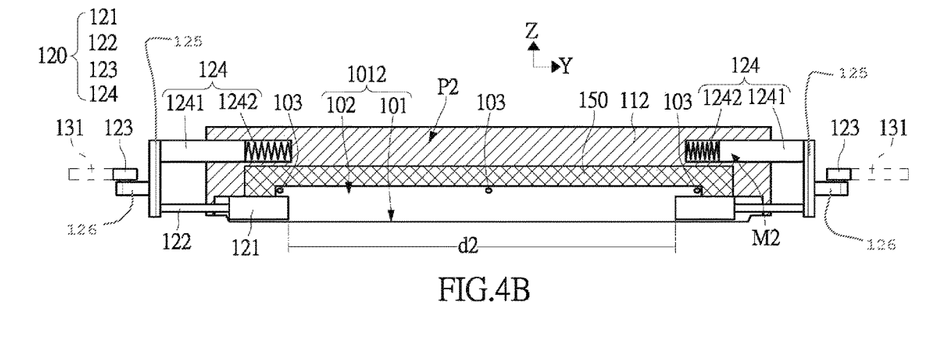
Figure 5:
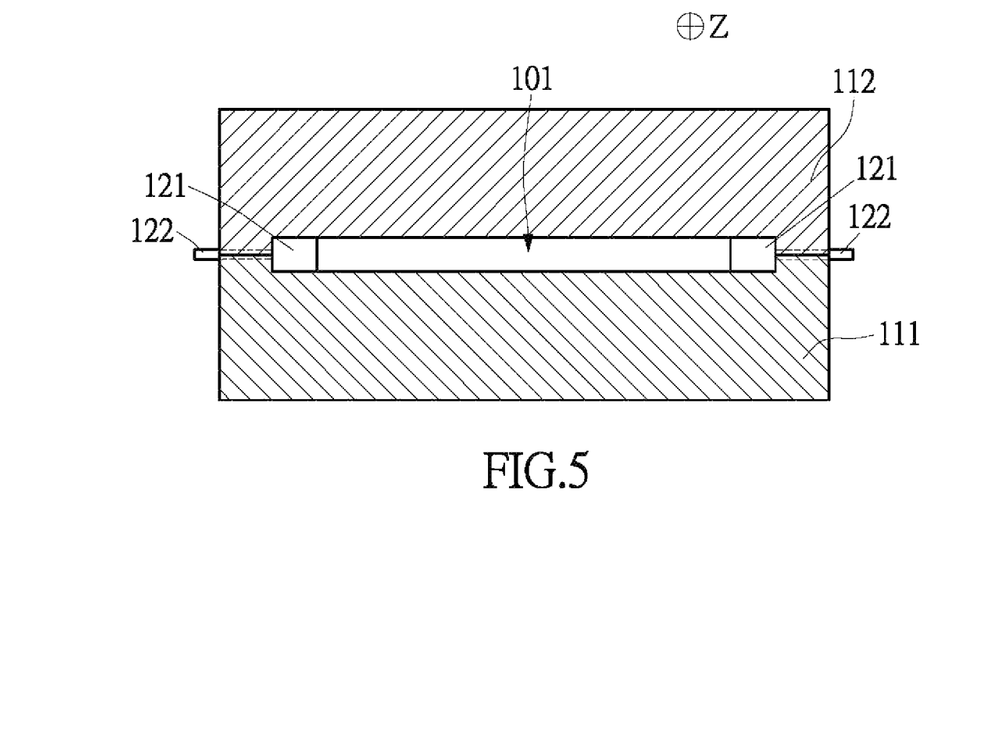
FIG. 5 shows a top view of a coating device according to an embodiment of the present disclosure.

FIG. 2 shows a partial perspective view of a coating device according to an embodiment of the present disclosure. FIG. 3 shows a partial exploded view of the coating device of FIG. 2. FIG. 4A and FIG. 4B are cross-sectional views of a female mold of a coating device during operation. FIG. 5 shows a top view of a coating device according to an embodiment of the present disclosure.

As shown in FIG. 2 and FIG. 3, the coating head 110 includes a male mold 111 and a female mold 112 joined together. The male mold 111 and the female mold 112 respectively have an assembly face P1 and an assembly face P2. The assembly face P1 of the male mold 111 and the assembly face P2 of the female mold 112 have substantially similar shapes and sizes. In the present embodiment, a first indentation 1011 is indented from the assembly face P1 of the male mold 111, and a second indentation 1012 is indented from the assembly face P2 of the female mold 112. The first indentation 1011 and the second indentation 1012 extend substantially in the direction of the y-axis and have substantially the same shapes and sizes, e.g. an elongated shape. The first indentation 1011 and the second indentation 1012 are positioned at corresponding positions. For example, the first indentation 1011 and the second indentation 1012 are respectively positioned at the bottom of the assembly face P1 of the male mold 111 and at the bottom of the assembly face P2 of the female mold 112. Namely, the first indentation 1011 is exposed at the bottom of the male mold 111 and the second indentation 1012 is exposed at the bottom of the female mold 112. As shown in FIG. 5, the coating head 110 has a coating-liquid outlet 101 defined by the first indentation 1011 and the second indentation 1012. In the present embodiment, the male mold 111 and the female mold 112 respectively have accommodating spaces M1 and M2.

A plurality of coating-liquid inlets 103 is formed at the second indentation 1012 of the female mold 112 for conducting a coating liquid from the outside to a coating-liquid channel 102 (described later) in the coating head 110. In another embodiment, the coating-liquid inlets 103 can be formed at the male mold 111. The coating-liquid channel 102 is positioned above the coating-liquid outlet 101. The width of the coating-liquid channel 102 can be marginally greater than, marginally smaller than or equal to the width of the slit-shaped coating-liquid outlet 101. The coating device 1 also includes a fixture pad 150 disposed between the male mold 111 and the female mold 112. Specifically, in the present embodiment, the fixture pad 150 is disposed in the space defined by the first indentation 1011 and the second indentation 1012, and a movable pad 121 is arranged along the z-axis with respect to the fixture pad 150. In the present embodiment, the fixture pad 150 can fit with the male mold 111 and the female mold 112, e.g. by screws.

The adjustment unit 120 is connected to the coating head 110 and includes the movable pad 121 disposed at the coating-liquid outlet 101, a connecting unit 122 for the movable pad 121, a sensor wheel 123, a frame 124, a stand 125, and a holding element 126. The frame 124 includes a rod 1241 and an elastic unit 1242. The sensor wheel 123 is connected to the movable pad 121 through the holding element 126, the stand 125 and the connecting unit 122.

When the male mold 111 and the female mold 112 are joined, the movable pad 121 is arranged between the male mold 111 and the female mold 112. In the present embodiment, the movable pad 121 is arranged in the space defined by the first indentation 1011 and the second indentation 1012, and the elastic units 1242 and the rods 1241 are disposed in the accommodating spaces M1 and M2. Specifically, the movable pad 121 is arranged at one side (or two sides) of the coating-liquid outlet 101, the movable pad 121 is disposed at the short edge of the coating-liquid outlet 101, and the height of the movable pad 121 can be marginally greater than, marginally smaller than or equal to the height of the coating-liquid outlet 101. One end of the elastic unit 1242 abuts the coating head 110 and the other end of the elastic unit 1242 abuts the rod 1241. The elastic unit 1242 can be compressed by the rod 1241 and the coating head 110.

The drive assembly 130 is connected to the adjustment unit 120 for controlling the motion of the movable pad 121 of the adjustment unit 120 along the y-axis. In the present embodiment, the drive assembly 130 is a patterned piece 131 having an edge 131L corresponding to the shape of the coat layer 3. The edge 131L extends along the direction of the x-axis and the sensor wheel 123 moves along the edge 131L.

It is easily seen that, from FIG. 1A to FIG. 1C, when the coating head 110 moves along the x-axis with respect to the substrate 2, the sensor wheel 123 rolls on the edge 131L of the patterned piece 131, and through the linked movement of the elastic unit 1242 and the rod 1241, the movable pad 121 moves along the y-axis to adjust the size of the opening of the coating-liquid outlet 101 (as shown in FIG. 4A and FIG. 4B, the size of the opening of the coating-liquid outlet 101 can be different widths d1 and d2).

The patterned piece 131 is removable and mounted according to needs of different products. The patterned piece 131 can be disposed at at least one side of the coating head 110 (in the present embodiment, patterned pieces 131 are disposed on both sides of the coating head 110). The edge 131L of the patterned piece 131 can have diverse specific shapes. The dimensions of the patterned piece 131 can also be designed according to the length and width of the coat pattern.

It is worth mentioning that another control system can embody the drive assembly 130, which can control the motion of the adjustment unit 120 by using computers to adjust the size of the opening of the slit-shaped coating-liquid outlet 101. Specifically, the drive assembly 130 can be a computer numerical control (CNC) system instead of patterned pieces 131. The connecting unit 122 for the movable pad 121 is connected to the control system, and the control system can adjust the motion of the movable pad 121 through programming.

The relative positions of the abovementioned components can be altered according to needs. The following describes other embodiments of coating devices according to the present disclosure. It must be noted that components which can be similar to those of the above embodiment are not further described.

Figure 6A:
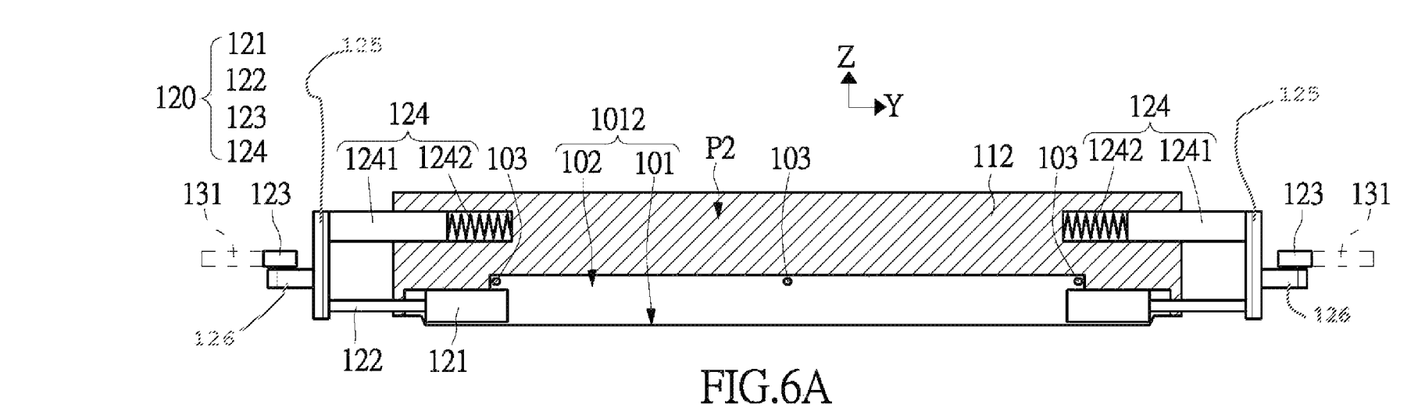
FIG. 6A shows a cross-sectional view of a female mold according to another embodiment.
Figure 6B:
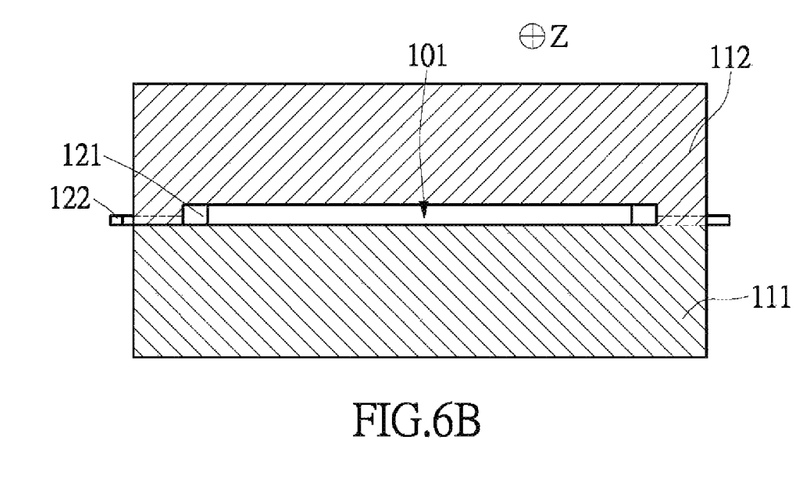
FIG. 6B shows a top view of a coating device according to another embodiment.

Referring to FIG. 3, FIG. 6A and FIG. 6B. FIG. 6A shows a cross-sectional view of a female mold according to another embodiment. FIG. 6B shows a top view of a coating device according to another embodiment. Comparing FIG. 6A and FIG. 4A, it can be seen that the position of the second indentation 1012 of the female mold 112 can be modified according to needs, such as saving the fixture pad 150 in the present embodiment. Comparing FIG. 6B and FIG. 5, it can be seen that the male mold 111 does not need to be formed a first indentation 1011.

Figure 7A:
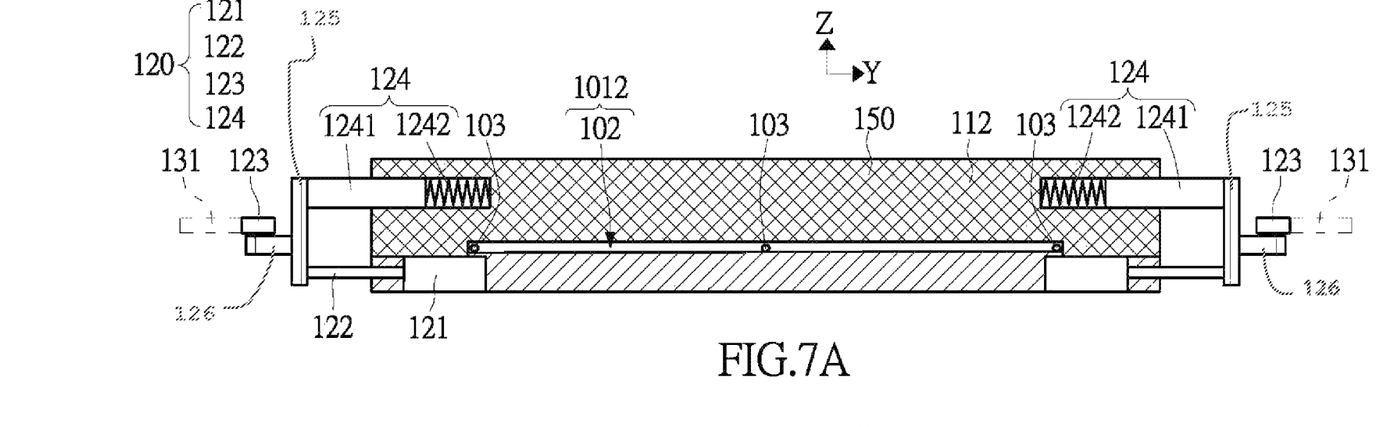
FIG. 7A shows a cross sectional view of a female mold according to yet another embodiment.
Figure 7B:
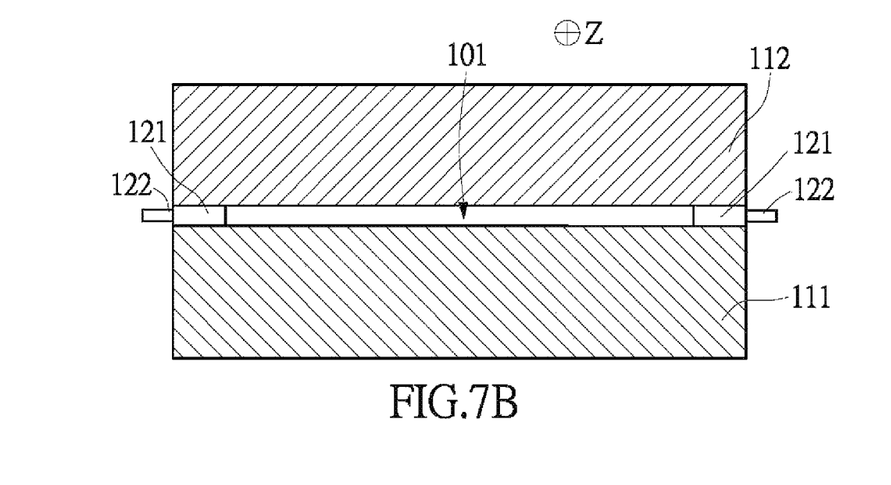
FIG. 7B shows a top view of another coating device according to yet another embodiment.

Referring to FIG. 3, FIG. 7A and FIG. 7B. FIG. 7A shows a cross-sectional view of a female mold according to yet another embodiment. FIG. 7B shows a top view of another coating device according to yet another embodiment. Comparing FIG. 7A to FIG. 4A, and FIG. 7B to FIG. 5, it can be seen that the shape of the female mold 112 can be modified according to need, and the second indentation 1012 of the female mold 112 can only be formed with a coating-liquid channel 102. At the same time, the male mold 111 does not need to be formed with a first indentation 1011. In the present embodiment, the movable pad 121 and the fixture pad 150 are arranged along the direction of the z-axis between the male mold 111 and the female mold 112. The fixture pad 150 is arranged between the male mold 111 and the female mold 112 so that a gap exists between the male mold 111 and the female mold 112. In other words, the male mold 111 and the female mold 112 are joined and a distance exists between the assembly face P1 of the male mold 111 and the assembly face P2 of the female mold 112, thereby forming the slit-shaped coating-liquid outlet 101. In the present embodiment, the male mold 111, the female mold 112 and the fixture pad 150 each have at least one screw hole. The positions and the dimensions of the screw holes on the male mold 111, the female mold 112 and the fixture pad 150 correspond such that screws or other fixture units can pass through the corresponding screw holes on the male mold 111, the female mold 112 and the fixture pad 150 for fixing the male mold 111, the female mold 112 and the fixture pad 150. In other words, the male mold 111 and the female mold 112 can be fixed to the fixture pad 150 by screws passing through the screw holes. The screws are evenly distributed to ensure even distribution of force on the fixture pad 150. It is easily seen that, in other embodiments the fixture pad 150 can be integrally formed as one body with the male mold 111 or the female mold 112.

In the above embodiments, the material of the male mold 111, the female mold 112, the fixture pad 150 and the movable pad 121 can be for example stainless steel.

In light of the above embodiments, it can be seen that the relationship between the components of the coating head 110 and the adjustment unit 120 (e.g. the positions and shapes of the indentations and accommodating spaces of the male mold and the female mold, the positions of the adjustment unit relative to the male mold and the female mold) can be modified according to need.

The following describes how the coating liquid enters the coating-liquid channel 102 through the coating-liquid inlet 103.

Figure 8:
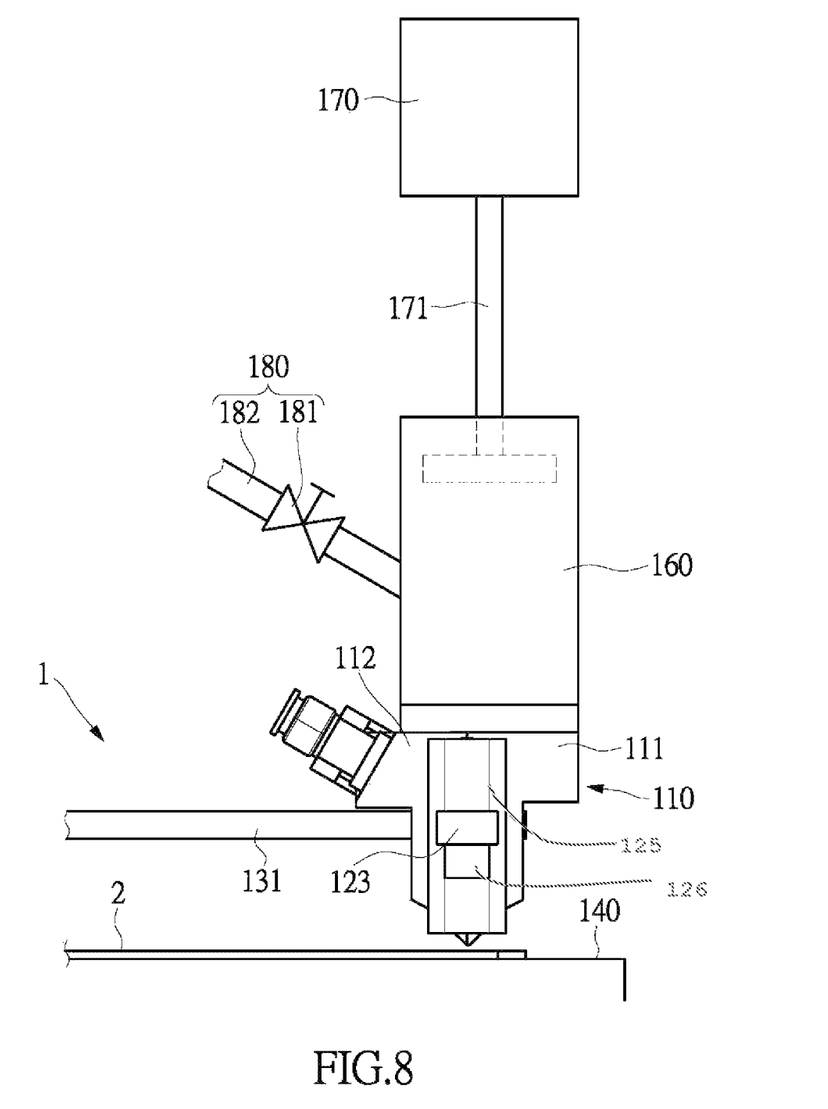
FIG. 8 shows a side view of a coating device according to an embodiment of the present disclosure.

Referring to FIG. 7A and FIG. 8. FIG. 8 shows a side view of a coating device according to an embodiment of the present disclosure. In an embodiment of the present disclosure, the coating device 1 further includes a coating-liquid storage unit 160 and a coating-liquid transport assembly 180. The coating-liquid storage unit 160 is connected to the coating head 110, for example by tubes to the coating-liquid inlets 103 of the female mold 112. The coating-liquid transport assembly 180 transports coating liquids to the coating-liquid storage unit 160. The coating-liquid transport assembly 180 can be for example a pump and can have a transport valve 181 and a transport tube 182. In the present embodiment, the coating device 1 further includes a coating-liquid pressure-control assembly 170 for controlling the pressure of the coating liquid being transported from the coating-liquid storage unit 160 to the coating head 110. The coating-liquid pressure-control assembly 170 can be for example a motor and can have a control valve 171.

It bears mentioning that in order to display the relative positions of essential components, the figures of the present disclosure omit some non-essential components. For example in FIG. 1A, the drive assembly 130 is seemingly suspended in air. A person skilled in the art should naturally understand that the figure is only illustrative and the drive assembly 130 can be fixed by external components in practice. The same applies to other components which are not further described herein.

In an embodiment of the present disclosure, the coating device 1 can include a control unit such as a neural network system or a programmable control system. The programmable control system controls the relative movement velocity and position of the coating head 110 and the carrying platform 140, precisely calculating the flow rate and velocity of the coating liquid and the movement velocity and position of the movable pad 121. The basic principle of coating control can be obtained by Bernoulli's equation:

$$\rho 1 V 1 A 1 = \rho 2 V 2 A 2,$$

$\rho$ is the density of the coating liquid, V is the flow velocity and A is the area of the flow-liquid outlet.

In other words, given a fixed flow liquid density, when the movable pad 121 reduces the area of the flow-liquid outlet, the relative velocity between the coating head 110 and the carrying platform 140 needs to be reduced or the pressure at the coating-liquid outlet of the coating head 110 needs to be reduced. The control unit can control the coating liquid flow velocity according to the coat pattern, and controls the coating process. By this configuration, the coating device 1 can produce a coating of a geometrically shaped pattern. Additionally, the control unit can extend to extract coating liquid in the coating head 110 to stabilize the thickness of the coating layer 3 produced by the coating liquid.

Figure 9:
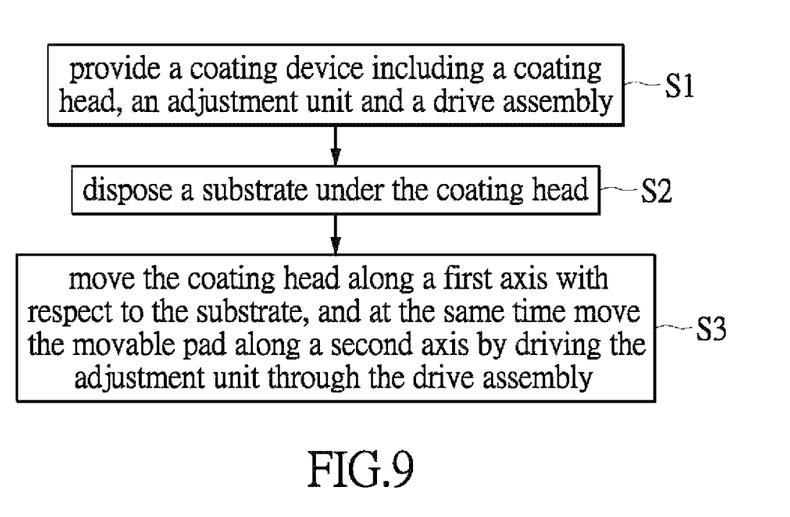
FIG. 9 shows a flowchart of a coating method according to an embodiment of the present disclosure.

The above embodiment is a coating method according to an embodiment of the present disclosure. FIG. 9 shows a flowchart of a coating method according to an embodiment of the present disclosure. First, provide a coating device 1 including a coating head 110 having a coating-liquid outlet 101; an adjustment unit 120 including a movable pad 121 disposed at the coating-liquid outlet 101; and a drive assembly 130 connected to the adjustment unit 120 (step S1). Refer to the above descriptions for the relationships between the components of the coating device 1. Then, dispose a substrate 2 under the coating head 110 (step S2). Finally, move the coating head 110 along the direction of the x-axis relative to the substrate 2 and at the same time move the movable pad 121 along the direction of the y-axis by driving the adjustment unit 120 through the drive assembly 130 for adjusting the size of the opening of the coating-liquid opening 101 (step S3).

The coating device 1 provided by the present embodiment can coat coating liquid onto the substrate 2. The coating device 1 can adjust the pattern coated on the substrate 2 through the movable pad 121 of the adjustment unit 120, to satisfy the need for irregular two dimensional shapes. Specifically, when the coating head 110 moves, the relative position of the movable pad 121 to the female mold 112 is adjusted. By adjusting the size of the opening of the slit-shaped coating-liquid outlet 101 during motion of the coating head 110, the coated pattern can have an irregular shape. The coating device 1 can coat a coat layer 3 of even thickness and special shapes.

The coating device 1 can achieve special coating shapes and thin films, while maintaining the density of the film and the chemical and physical reliability. The coating device 1 can avoid problems of having to reuse the wasted coating liquid. The coating device 1 produces a more even film of less surface roughness. During optical film manufacturing, the influence of rough surfaces on optical effects is reduced, reducing the effects of light dispersion and gradient. Additionally, the coating device 1 can use coating liquids of different viscosities and ingredients. Moreover, the coating device 1 can increase the usage rate of the substrate during patterning and quickly produce films.

The descriptions illustrated supra set forth simply the preferred embodiments of the present disclosure; however, the characteristics of the present disclosure are by no means restricted thereto. All changes, alternations, or modifications conveniently considered by those skilled in the art are deemed to be encompassed within the scope of the present disclosure delineated by the following claims.

What is claimed is:

1. A pattern coating device, comprising:
    a coating head having a coating-liquid outlet, wherein the pattern coating device is configured to vary a relative position between the coating head and a substrate along a first axis for forming a pattern by coating a coating liquid on the substrate through the coating-liquid outlet;
    an adjustment unit comprising:
        a stand disposed at a side of the coating head;
        a movable pad disposed at the coating-liquid outlet and configured to move along a second axis to adjust a size of an opening of the coating-liquid outlet, wherein a relative position between an end of the movable pad defining the opening and the stand is fixed while moving the movable pad along the second axis;
        a rod fixed to the stand and spaced apart from the movable pad;
        an elastic unit, wherein:
            one end of the elastic unit abuts the coating head and another end of the elastic unit abuts the rod along the second axis, and
            a linked movement of the elastic unit and the rod controls a motion of the movable pad along the second axis away from a central region of the coating-liquid outlet; and
        a holding element fixed to a first side of the stand, wherein the rod and the movable pad are fixed to a second side of the stand opposite to the first side; and
    a drive assembly for controlling a motion of the movable pad along the second axis toward the central region of the coating-liquid outlet.

2. The pattern coating device according to claim 1, further comprising a carrying platform for carrying the substrate.

3. The pattern coating device according to claim 2, wherein the substrate is attached to the carrying platform by suction, static electricity, or mechanical means.

4. The pattern coating device according to claim 1, wherein:
    the coating head comprises a male mold and a female mold joined together, and
    the movable pad is disposed between the male mold and the female mold.

5. The pattern coating device according to claim 4, further comprising a fixture pad disposed between the male mold and the female mold and arranged along a third axis relative to the movable pad.

6. The pattern coating device according to claim 1, further comprising a coating-liquid storage unit and a coating-liquid transport assembly, wherein:
    the coating-liquid storage unit is connected to the coating head, and
    the coating-liquid transport assembly transports a coating-liquid from a foreign portion to the coating-liquid storage unit.

7. The pattern coating device according to claim 6, wherein the coating-liquid transport assembly is a pump.

8. The pattern coating device according to claim 7, further comprising a coating-liquid pressure-control assembly for controlling a pressure of the coating-liquid transported from the coating-liquid storage unit to the coating head.

9. The pattern coating device according to claim 8, wherein the coating-liquid pressure-control assembly is a motor.

10. The pattern coating device according to claim 1, further comprising a control unit comprising a neural network system or a programmable control system.

11. The pattern coating device according to claim 4, wherein:
    the male mold comprises a first indentation and the female mold comprises a second indentation corresponding to the first indentation, and
    the coating-liquid outlet is defined by the first indentation and the second indentation.

12. The pattern coating device according to claim 1, wherein the adjustment unit further comprises at least one connecting unit connecting to the movable pad and the stand along the second axis.

13. The pattern coating device according to claim 1, wherein the stand is disposed between the coating head and a pattern piece of the drive assembly.

14. The pattern coating device according to claim 1, wherein:
    the coating head comprises an accommodating space in which part of the rod is disposed, and
    the accommodating space is separated from the coating-liquid outlet.

15. The pattern coating device according to claim 1, wherein the adjustment unit further comprises a sensor wheel disposed on the holding element.

16. The pattern coating device of claim 15, wherein:
    the drive assembly comprises a pattern piece having an irregular edge, and
    the sensor wheel is configured to move along the irregular edge of the pattern piece.

17. The pattern coating device according to claim 1, wherein:
    the drive assembly comprises a pattern piece having an irregular edge, and
    a shape of the pattern is formed corresponding to the irregular edge of the pattern piece.

18. A pattern coating device, comprising:
    a coating head having a coating-liquid outlet, wherein the pattern coating device is configured to vary a relative position between the coating head and a substrate along a first axis for forming a pattern by coating a coating liquid on the substrate through the coating-liquid outlet;
    an adjustment unit comprising:
        a stand disposed at a side of the coating head;
        a movable pad disposed at the coating-liquid outlet, fixed to the stand, and configured to move along a second axis to adjust a size of an opening of the coating-liquid outlet;

a rod fixed to the stand and spaced apart from the movable pad;

an elastic unit, wherein one end of the elastic unit abuts the coating head and another end of the elastic unit abuts the rod along the second axis, wherein a linked movement of the elastic unit and the rod controls motion of the movable pad along the second axis away from a central region of the coating-liquid outlet;

a holding element fixed to a first side of the stand, wherein the rod and the movable pad are fixed to a second side of the stand opposite to the first side; and a sensor wheel disposed on the holding element; and a drive assembly comprising a pattern piece having an irregular edge for controlling a motion of the movable pad along the second axis toward the central region of the coating-liquid outlet, wherein:

the sensor wheel is configured to move along the irregular edge of the pattern piece, and a shape of the pattern is formed corresponding to the irregular edge of the pattern piece.

\* \* \* \* \*